(12) United States Patent
Li et al.

(10) Patent No.: US 10,090,240 B2
(45) Date of Patent: Oct. 2, 2018

(54) INTERCONNECT STRUCTURE WITH CAPACITOR ELEMENT AND RELATED METHODS

(71) Applicant: GLOBALFOUNDRIES INC., Grand Cayman (KY)

(72) Inventors: Baozhen Li, South Burlington, VT (US); Chih-Chao Yang, Glenmont, NY (US); Keith Kwong Hon Wong, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/172,551

(22) Filed: Jun. 3, 2016

(65) Prior Publication Data

US 2017/0352619 A1    Dec. 7, 2017

(51) Int. Cl.

| | |
|---|---|
| *H01L 23/522* | (2006.01) |
| *H01L 21/768* | (2006.01) |
| *H01L 49/02* | (2006.01) |
| *H01L 23/532* | (2006.01) |

(52) U.S. Cl.
CPC .... *H01L 23/5223* (2013.01); *H01L 21/76807* (2013.01); *H01L 21/76831* (2013.01); *H01L 21/76877* (2013.01); *H01L 28/60* (2013.01); *H01L 23/5329* (2013.01); *H01L 23/53223* (2013.01); *H01L 23/53238* (2013.01); *H01L 23/53266* (2013.01)

(58) Field of Classification Search
CPC ........................ H01L 23/5222–23/5225; H01L 21/76807–21/76831; H01L 2221/1015–2221/1036; H01L 28/40–28/92
See application file for complete search history.

(56) References Cited

U.S. PATENT DOCUMENTS

| | | |
|---|---|---|
| 5,675,184 A | 10/1997 | Matsubayashi et al. |
| 5,879,985 A | 3/1999 | Gambino et al. |
| 6,461,914 B1 | 10/2002 | Roberts et al. |
| 6,518,670 B1 | 2/2003 | Mandelman et al. |
| 6,624,040 B1 * | 9/2003 | Ng .................... H01L 21/76811 257/E21.018 |
| 6,638,352 B2 * | 10/2003 | Satsu ...................... C08L 79/08 106/287.11 |

(Continued)

OTHER PUBLICATIONS

Clark, Emerging Applications for High K Materials in VLSI Technology, MDPI, 2014—https://www.ncbi.nlm.nih.gov/pmc/articles/PMC5453339/.*

*Primary Examiner* — David Zarneke
(74) *Attorney, Agent, or Firm* — David Cain; Hoffman Warnick LLC

(57) ABSTRACT

Various embodiments include methods and integrated circuit structures. In some cases, a method of forming an integrated circuit structure can include: forming an opening in a low-k dielectric layer; filling the opening with a high-k dielectric material; patterning the low-k dielectric layer outside of the opening and the high-k dielectric layer to form an interconnect opening within the low-k dielectric layer and a capacitor opening within the high-k dielectric layer; and filling the interconnect opening and the capacitor opening with a metal to form an interconnect in the low-k dielectric layer and a capacitor in the high-k dielectric layer.

16 Claims, 6 Drawing Sheets

(56) References Cited

U.S. PATENT DOCUMENTS

| | | | |
|---|---|---|---|
| 6,638,830 B1 * | 10/2003 | Tsai | H01L 23/5223 |
| | | | 257/306 |
| 6,670,237 B1 | 12/2003 | Loh et al. | |
| 6,700,153 B2 | 3/2004 | Oh et al. | |
| 6,764,915 B2 | 7/2004 | Lee | |
| 7,160,772 B2 * | 1/2007 | Coolbaugh | H01L 21/76808 |
| | | | 257/E21.008 |
| 7,554,146 B2 * | 6/2009 | Won | H01L 28/60 |
| | | | 257/296 |
| 9,269,663 B2 * | 2/2016 | Keller | H01L 23/5223 |
| 2002/0155676 A1 * | 10/2002 | Stetter | H01L 28/40 |
| | | | 438/393 |
| 2006/0089001 A1 * | 4/2006 | Erickson | H01L 23/5223 |
| | | | 438/694 |
| 2007/0235838 A1 * | 10/2007 | Wang | H01G 4/005 |
| | | | 257/532 |
| 2009/0224359 A1 * | 9/2009 | Chang | H01L 23/5223 |
| | | | 257/522 |

* cited by examiner

INTERCONNECT STRUCTURE WITH CAPACITOR ELEMENT AND RELATED METHODS

BACKGROUND

The subject matter disclosed herein relates to integrated circuit devices. More particularly, the subject matter relates to processes in forming integrated circuit devices.

As integrated circuit (IC) technologies have advanced, the size of these devices has correspondingly decreased. Smaller ICs call for greater control over device topography. For example, when patterning upper electrodes in an IC capacitor device, conventional approaches may fail to adequately control the etching process, and cause dielectric damage proximate the capacitor. In order to control this unreliable process, conventional methods employ additional masking processes, which can be time consuming and expensive.

SUMMARY

Various embodiments include methods and integrated circuit structures. In some cases, a method of forming an integrated circuit structure can include: forming an opening in a low-k dielectric layer; filling the opening with a high-k dielectric material; patterning the low-k dielectric layer outside of the opening and the high-k dielectric layer to form an interconnect opening within the low-k dielectric layer and a capacitor opening within the high-k dielectric layer; and filling the interconnect opening and the capacitor opening with a metal to form an interconnect in the low-k dielectric layer and a capacitor in the high-k dielectric layer.

A first aspect of the disclosure includes a method of forming an integrated circuit structure, the method including: forming an opening in a low-k dielectric layer; filling the opening with a high-k dielectric material; patterning the low-k dielectric layer outside of the opening and the high-k dielectric layer to form an interconnect opening within the low-k dielectric layer and a capacitor opening within the high-k dielectric layer; and filling the interconnect opening and the capacitor opening with a metal to form an interconnect in the low-k dielectric layer and a capacitor in the high-k dielectric layer.

A second aspect of the disclosure includes a method of forming an integrated circuit structure, the method including: forming an opening in a low-k dielectric layer; filling the opening with a high-k dielectric material, wherein a k-value of the high-k dielectric is at least double a k-value of the low-k dielectric layer, wherein the opening extends only partially into a depth of the low-k dielectric layer such that the low-k dielectric layer abuts the high-k dielectric material on at least two sides; patterning the low-k dielectric layer outside of the opening and the high-k dielectric material to form an interconnect opening within the low-k dielectric layer and a capacitor opening within the high-k dielectric material; and filling the interconnect opening and the capacitor opening with a metal to form an interconnect in the low-k dielectric layer and a capacitor in the high-k dielectric material.

A third aspect of the disclosure includes an integrated circuit (IC) structure having: a low-k dielectric layer; a high-k dielectric material within the low-k dielectric layer and abutting the low-k dielectric layer, the high-k dielectric material extending only partially into a depth of the low-k dielectric layer, wherein a k-value of the high-k dielectric is at least double a k-value of the low-k dielectric; a capacitor within the high-k dielectric material; and an interconnect within the low-k dielectric layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
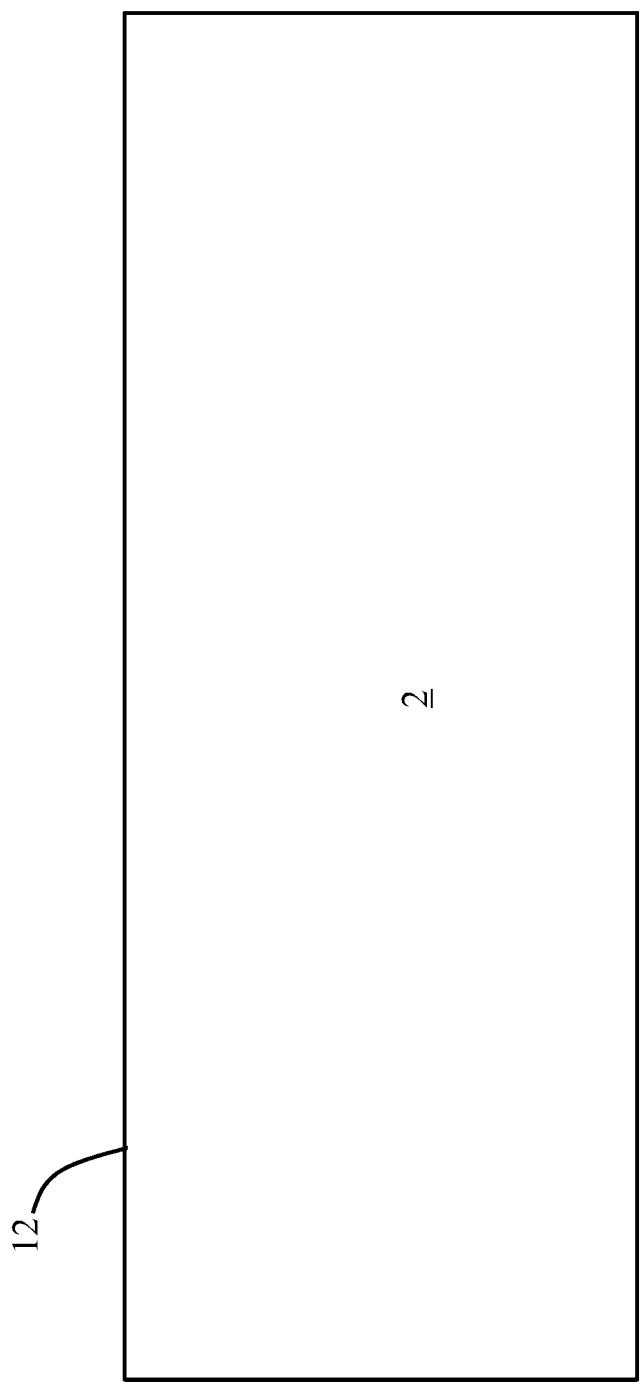
FIG. 1 shows a schematic cross-sectional view of a low-k dielectric layer, according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit (IC) devices. More particularly, the subject matter relates to processes in forming IC devices and the devices formed by such processes.

In contrast to conventional approaches, various embodiments of the disclosure include approaches for forming integrated circuit structures with devices (e.g., capacitors and interconnects) on a same level, within materials having significantly distinct k-values. That is, according to various embodiments, approaches described herein can be used to form devices which have increased capacitance (a function of higher k-value sections) and reliability without requiring increased space, when compared with conventional IC structures and methods of forming such structures. These devices can be formed with minimal additional steps to the traditional process flow, thereby maintaining low costs.

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIGS. 1-5 show schematic cross-sectional depictions of integrated circuit structures (and precursor structures) that illustrate processes performed according to various embodiments. It is understood that the processes outlined herein may be performed in a different order than described in some embodiments. Additionally, not all of the processes outlined herein need necessarily be performed according to various embodiments.

FIG. 1 shows a schematic cross-sectional view of a low-k dielectric layer 2. In various embodiments, low-k dielectric layer 2 can include at least one of SiCOH, SiLK, JSR, or a porous dielectric. In some cases, low-k dielectric layer 2 can have a k-value between approximately 2 and approximately 3.2.

Figure 2:
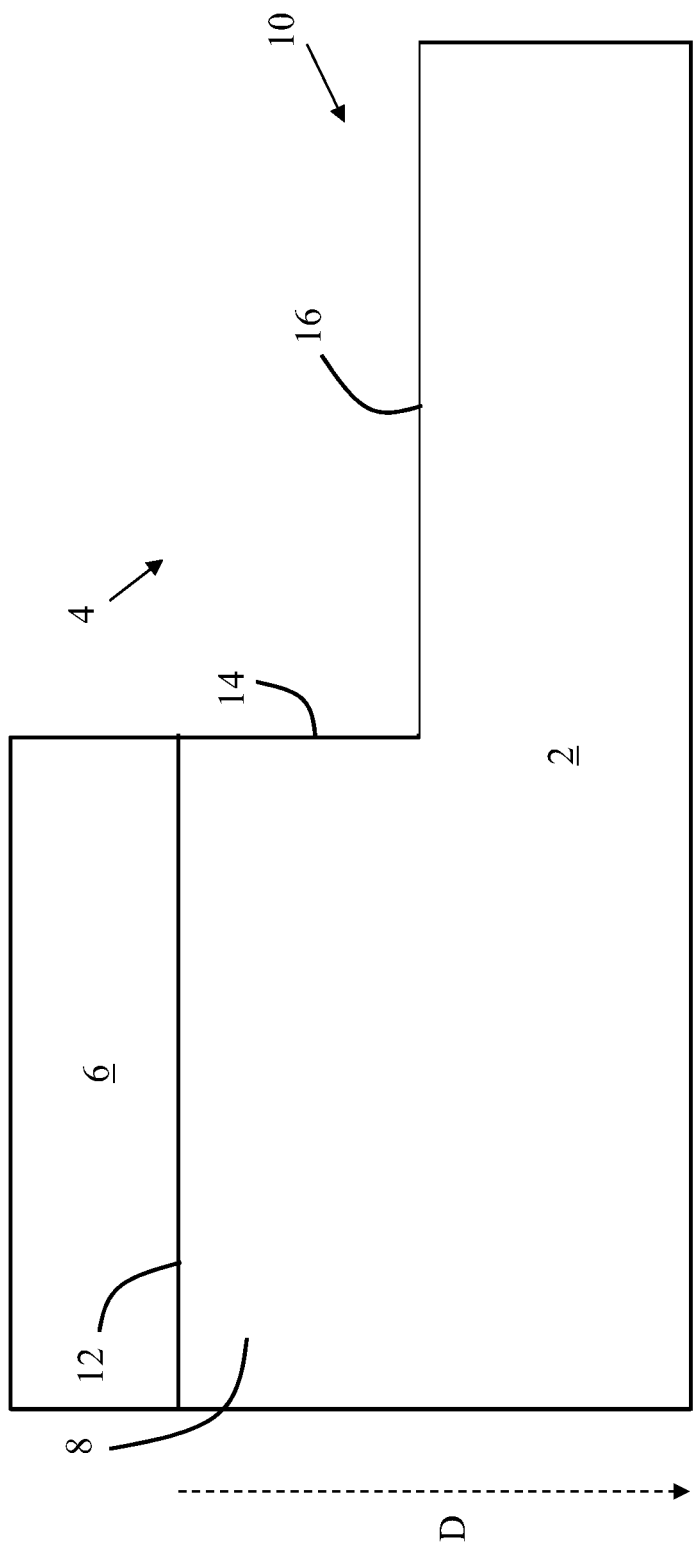
FIG. 2 shows a schematic cross-sectional view of the structure of FIG. 1, undergoing a process according to various embodiments.

FIG. 2 illustrates a first process in a method according to various embodiments. As shown, the process can include forming an opening 4 in low-k dielectric layer 2. In various embodiments, opening 4 is formed by masking low-k dielectric layer 2 (e.g., by depositing or otherwise forming a mask 6 over a first portion 8 of low-k dielectric layer 2, and etching low-k dielectric layer 2 to expose a second portion 10 of low-k dielectric layer 2 below its upper surface 12. In various embodiments, mask 6 can include a conventional photoresist and/or hardmask material, such as a nitride, e.g., a silicon nitride. In some cases, mask 6 is deposited over low-k dielectric layer 2 using conventional deposition techniques, however, in other cases, mask 6 may be epitaxially grown or otherwise formed over low-k dielectric layer 2. In some cases, mask 6 may be formed using conventional photolithography techniques, including but not limited to deep ultraviolet (DUV) or extreme ultraviolet (EUV) processes, sidewall imaging transfer processes, or multiple patterning processes. As shown, opening 4 can have at least one sidewall 14 and a lower surface (or bottom surface) 16. After opening 4 is formed, mask 6 can be removed according to conventional processes, e.g., via conventional etching techniques such as wet etching or dry etching. In some cases, mask 6 can be removed using a chemical etching process. For example, remaining mask 6 can be removed, e.g., by dry plasma ashing or (selectively) wet cleaning (e.g., using sulfuric peroxide).

Figure 3:
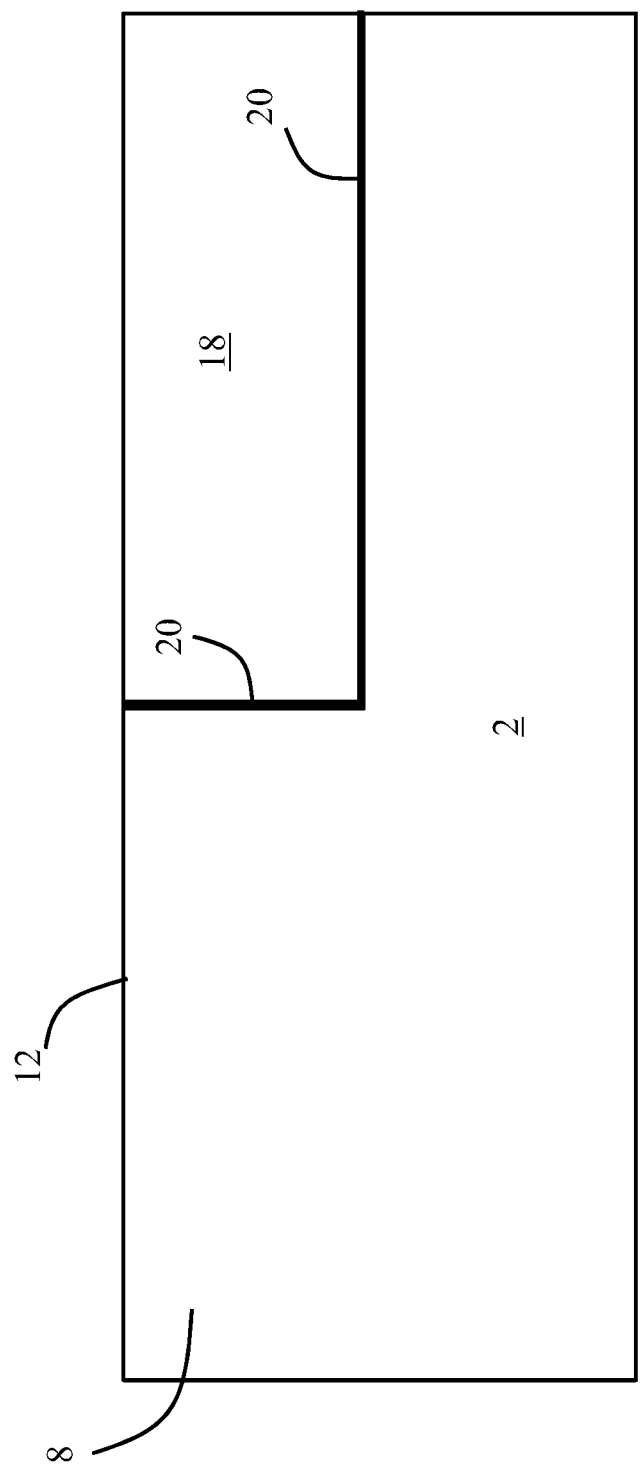
FIG. 3 shows a schematic cross-sectional view of a structure undergoing an additional process in a method according to various embodiments.

FIG. 3 shows an additional process including filling opening 4 with a high-k dielectric material 18. In various embodiments, filling opening 4 includes substantially filling opening 4, such that nearly an entirety of opening is filled with high-k dielectric material 18. This process can include depositing, epitaxially growing, or otherwise forming high-k dielectric material 18 in opening 4. In various embodiments, high-k dielectric material 18 can include at least one of: $TaO_5$, $PSiN_x$, SiON, $TaO_2$, $ZrO_2$, $HfO_2$, or $Al_2O_3$. In some cases, high-k dielectric material 18 can have a k-value between approximately 8 and approximately 40. According to various embodiments, the k-value of high-k dielectric material 18 is at least double the k-value of low-k dielectric layer 2. It is understood that in the process of filling opening 4, e.g., where mask 6 has been removed, high-k dielectric material 18 may over-fill opening 4 and need to be polished (planarized) back, as is known in the art. In some cases, opening 4 extends only partially into a depth (D) of low-k dielectric layer 2 such that low-k dielectric layer 2 abuts high-k dielectric material 18 on at least two sides (e.g., along sidewall 14 and bottom surface 16 of opening 4, now filled).

In some optional embodiments, an additional intermediate step can include forming a liner 20 in opening 4 within low-k dielectric layer 2, where the liner 20 extends along sidewall 14 of opening 4 and bottom surface 16 of opening 4. In various embodiments, liner 20 can be deposited as described herein, or epitaxially grown, along sidewall 14 and bottom surface 16. Liner 20 can be conformally deposited in some cases, in order to adhere to sidewall 14 as well as bottom surface 16. Liner 20 can include at least one of: a surface treatment layer of low-k dielectric layer 2, or a thin layer of silicon carbide, silicon oxycarbide, parylene and/or silicon nitride.

Figure 4:
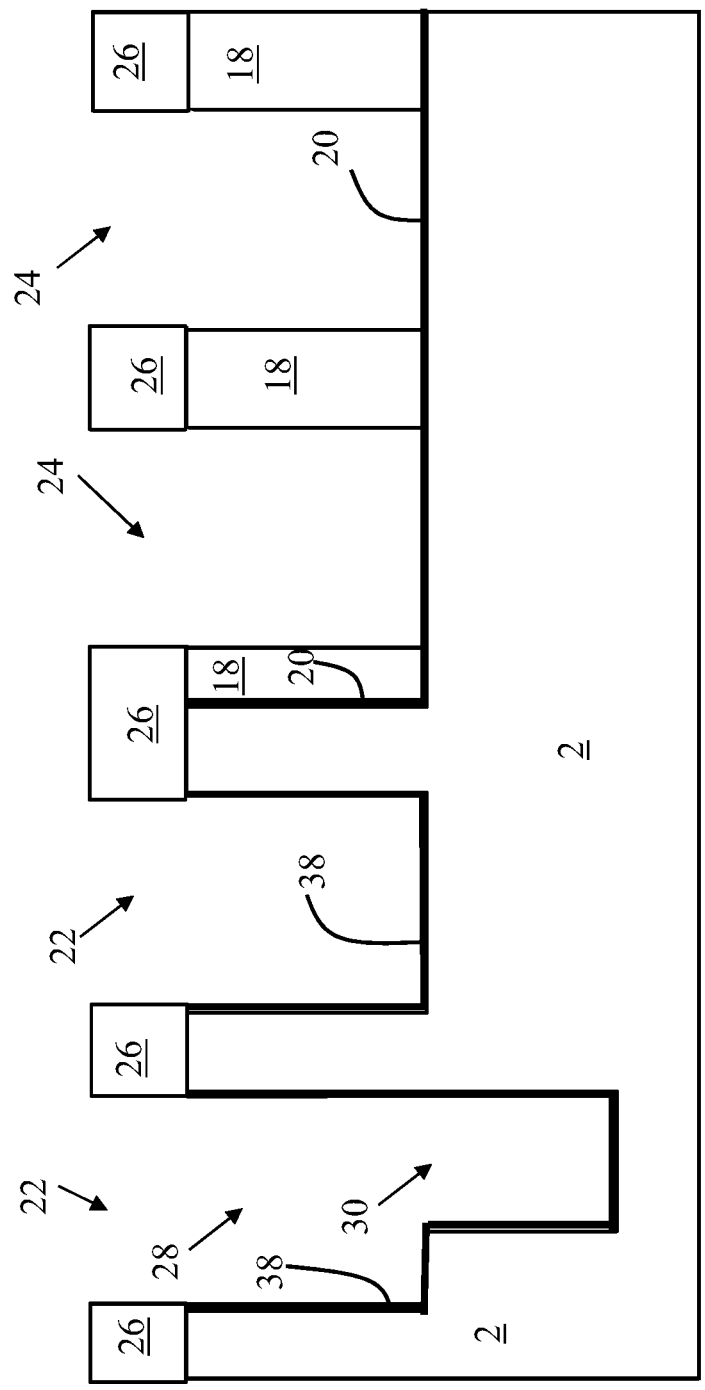
FIG. 4 shows a schematic cross-sectional view of a structure undergoing an additional process in a method according to various embodiments.

As shown in FIG. 4, following filling opening 4 with high-k dielectric material 18, the process may further include patterning low-k dielectric layer 2 outside of opening 4 and high-k dielectric material 18 to form an interconnect opening 22 within low-k dielectric layer 2 and a capacitor opening 24 within high-k dielectric material 18. In various embodiments, this process can include forming a mask 26 (e.g., hardmask, formed of titanium nitride (TiN) or aluminum nitride (AlN)) or any other mask described herein (e.g., mask 6) or known in the art) over low-k dielectric layer 2 and high-k dielectric material 18. Mask 26 can be formed according to any conventional processes described herein (e.g., with respect to mask 6) or known in the art, e.g., deposition and exposure, epitaxial growth, etc. Mask 26 may be selectively formed to allow for subsequent patterning of underlying low-k dielectric layer 2 and high-k dielectric material 18. In various embodiments, the patterning process used to form interconnect opening 22 within low-k dielectric layer 2 and a capacitor opening 24 within high-k dielectric material 18 can include conventional etching known in the art, e.g., dry etching, wet chemical etching, or reactive ion etching (RIE). In some cases, as shown on the left-hand side of FIG. 4, patterning of low-k dielectric layer 2 includes dual damascene patterning to form a line opening 28 and a via opening 30 connected with the line opening 28. In various embodiments, both high-k dielectric material 18 and low-k dielectric layer 2 are patterned concurrently (e.g., in a single process).

After interconnect opening 22 and capacitor opening 24 are formed, mask 26 can be removed according to conventional processes, e.g., via conventional etching techniques such as wet etching or dry etching. In some cases, mask 26 can be removed using a chemical etching process. For example, remaining mask 26 can be removed, e.g., by dry plasma ashing or (selectively) wet cleaning (e.g., using sulfuric peroxide).

Figure 5:
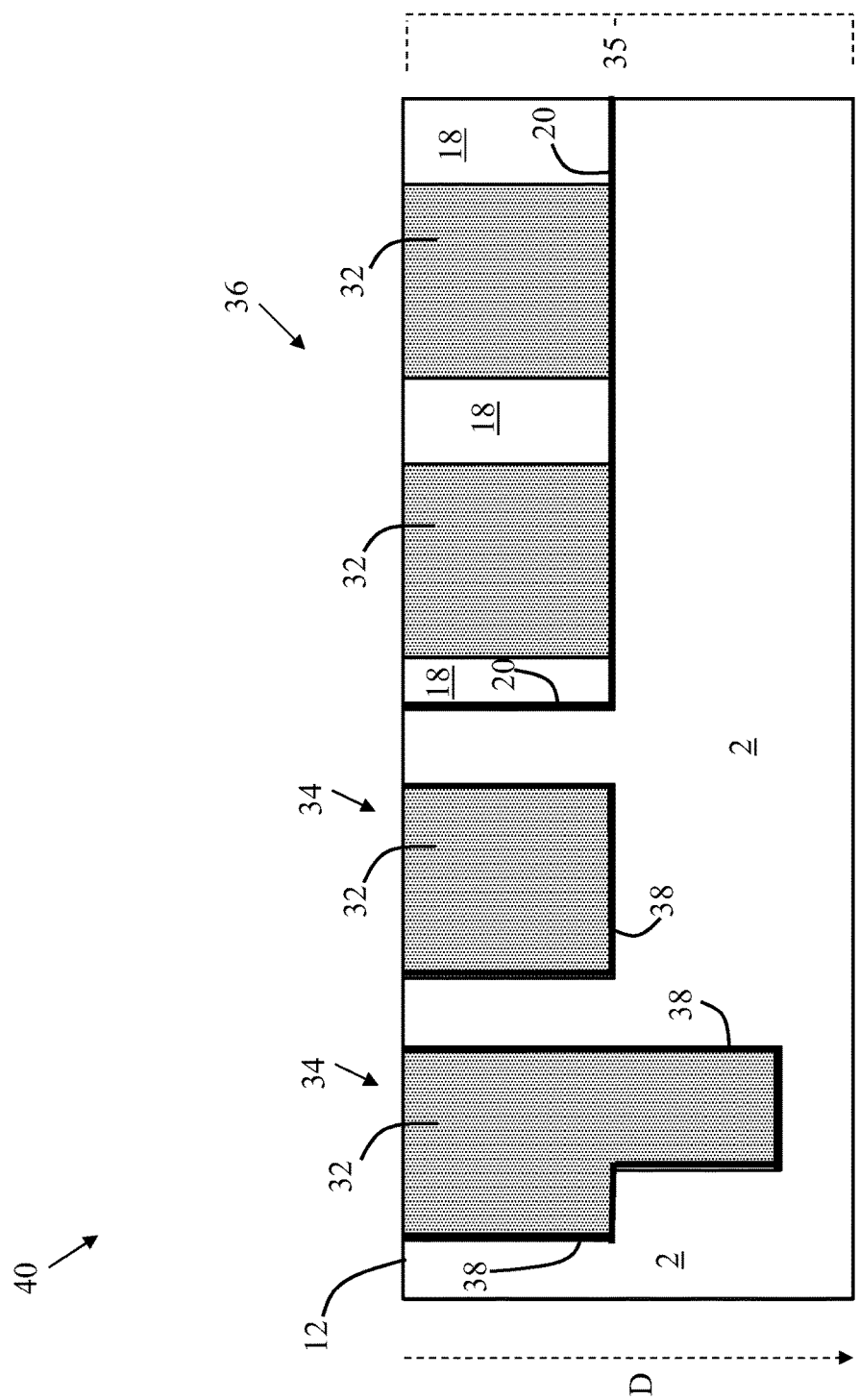
FIG. 5 shows a schematic cross-sectional view of an integrated circuit structure formed according to various embodiments.

As shown in FIG. 5, in various embodiments, an additional process can include filling interconnect opening 22 and capacitor opening 24 with a metal 32 to form an interconnect 34 (two shown) in low-k dielectric layer 2 and a capacitor 36 in high-k dielectric material 18. Metal 32 can include any conventional metal used to form a line, interconnect and/or via, e.g., copper (Cu), aluminum (Al), Cu (Al) or tungsten. Metal 32 may be deposited, plated, etc., in a single process, such that interconnect 34 and capacitor 36 can be formed during the same process (e.g., at substantially the same time). In some optional embodiments, as illustrated in FIG. 4, the process can further include forming a liner 38 in interconnect opening 22 and capacitor opening 24. Liner 38 can be formed according to various conventional approaches, e.g., via deposition, plating (e.g., electroless plating or electrolytic plating), or epitaxial growth. Liner 38 can include at least one of Ta (N), Ti (N), W (N), Co (N,P,W), or Ru (N,P,W). It is understood that in the process of filling interconnect opening 22 and capacitor opening 24, e.g., where mask 26 has been removed, metal 32 may over-fill interconnect opening 22 and capacitor opening 24 and need to be polished (planarized) back, as is known in the art.

FIG. 5 shows a cross-sectional view of an IC structure 40 formed according to various embodiments, where IC structure includes: low-k dielectric layer 2; high-k dielectric 18 within low-k dielectric layer 2 and abutting low-k dielectric layer 2, capacitor 36 within high-k dielectric material 18 and interconnect 34 within low-k dielectric layer 2. In various embodiments, high-k dielectric material 18 extends only partially into a depth (D) of low-k dielectric layer 2. As noted herein, the k-value of high-k dielectric material 18 is at least double the k-value of adjacent low-k dielectric layer 2. In various embodiments, capacitor 36 and interconnect 34 are formed within a same level 35 of IC structure 40 (e.g., at approximately a same depth (D) as measured from upper surface 12), in materials having significantly distinct k-values.

Figure 7:
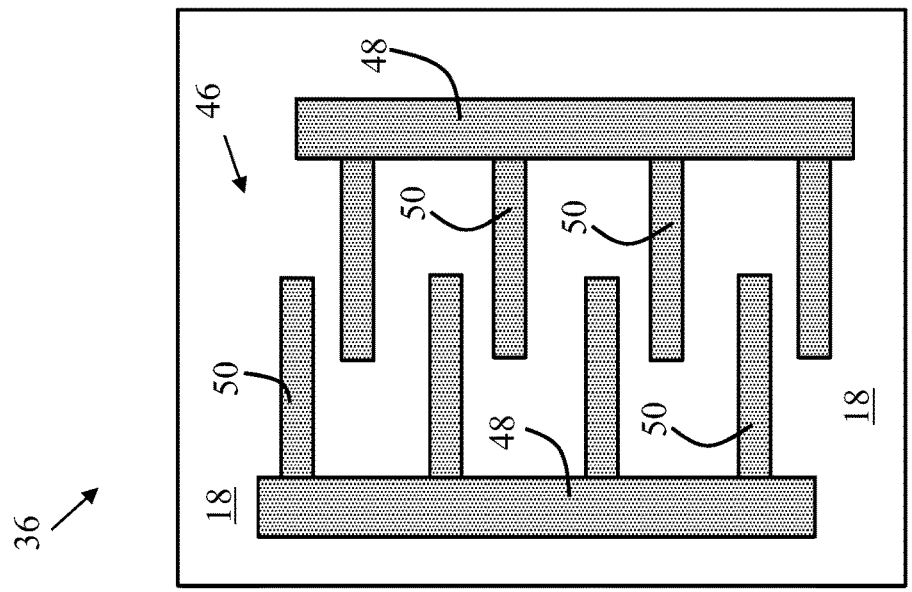
FIG. 7 shows a top view of another embodiment of capacitor within a high-k dielectric material according to various embodiments.
Figure 6:
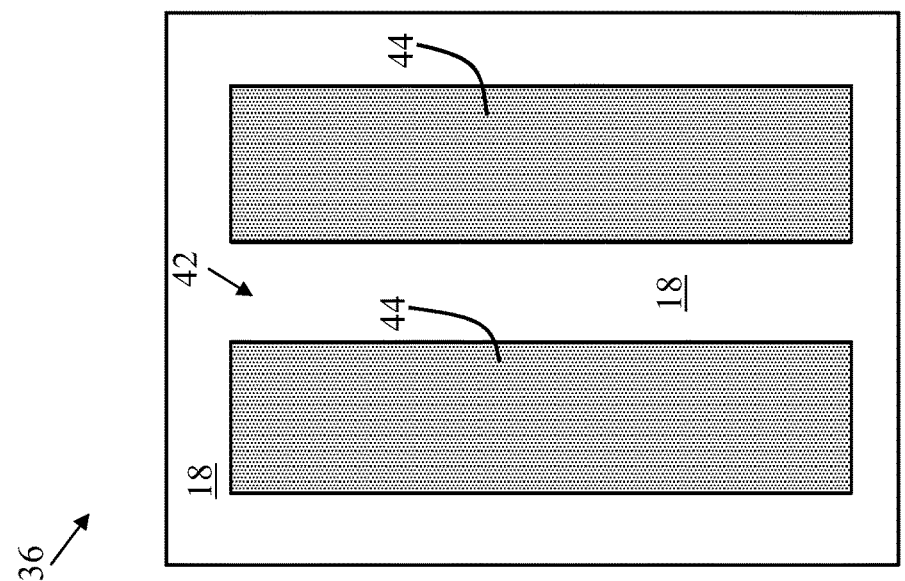
FIG. 6 shows a schematic top view of one embodiment of capacitor within a high-k dielectric material according to various embodiments.

FIG. 6 shows a schematic top view of one embodiment of capacitor 36 within high-k dielectric material 18, where capacitor 36 includes a parallel-line capacitor 42 formed from two parallel lines 44. FIG. 7 shows a top view of another embodiment of capacitor 36 within high-k dielectric material 18, where capacitor 36 includes a serpentine capacitor 46 having two parallel main lines 48, and a set of branches 50 extending from each of the main lines 48 toward the other main line 48. These branches 50 can extend between main lines 48 such that adjacent branches 50 from opposing main lines 48 can overlap in the primary direction of the main lines 48.

It is understood that the herein-noted approaches can be implemented in any stage of integrated circuit formation, e.g., front-end of line (FEOL), back-end of line (BEOL) and/or middle of line (MOL) processes. As is known in the art, FEOL can include operations performed on the semiconductor wafer in the course of device manufacturing up to first metallization, BEOL can include operations performed on the semiconductor wafer in the course of device manufacturing following first metallization, and MOL can include operations performed on the semiconductor wafer during first metallization.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit (IC) structure, the method comprising:
   forming an opening in a low-k dielectric layer;
   filling the opening with a high-k dielectric material;
   patterning the low-k dielectric layer outside of the opening and the high-k dielectric material to form an interconnect opening within the low-k dielectric layer and a capacitor opening within the high-k dielectric material, wherein the low-k dielectric layer and the high-k dielectric material are patterned concurrently; and
   filling the interconnect opening and the capacitor opening with a metal to form an interconnect in the low-k dielectric layer and a capacitor in the high-k dielectric material.

2. The method of claim 1, wherein a k-value of the high-k dielectric material is at least double a k-value of the low-k dielectric layer.

3. The method of claim 1, wherein the opening extends only partially into a depth of the low-k dielectric layer such that the low-k dielectric layer abuts the high-k dielectric material on at least two sides.

4. The method of claim 3, wherein the filling includes completely filling the opening, and wherein nearly an entirety of the opening is filled with the high-k dielectric material by the filling.

5. The method of claim 1, further comprising forming a liner in the opening within the low-k dielectric layer, wherein the liner extends along a sidewall of the opening and a bottom surface of the opening.

6. The method of claim 1, wherein the high-k dielectric material includes at least one of $TaO_5$, $PSiN_x$, SiON, $TaO_2$, $ZrO_2$, $HfO_2$, or $Al_2O_3$.

7. The method of claim 1, wherein the low-k dielectric layer includes at least one of SiCOH, SiLK, JSR or a porous dielectric.

8. The method of claim 1, wherein the patterning of the low-k dielectric layer includes dual damascene patterning to form a line opening and a via opening connected with the line opening.

9. The method of claim 1, wherein the filling of the interconnect opening and the capacitor opening with the metal is performed in a single process.

10. The method of claim 1, further comprising forming a liner in the interconnect opening and the capacitor opening prior to filling the interconnect opening and the capacitor opening with the metal.

11. The method of claim 1, wherein filling the interconnect opening and the capacitor opening forms the interconnect and the capacitor on a same level of the IC structure, wherein the same level of the IC structure is defined as a same depth as measured from an upper surface of the low-k dielectric layer.

12. A method of forming an integrated circuit (IC) structure, the method comprising:

forming an opening in a low-k dielectric layer, wherein the low-k dielectric layer includes at least one of SiCOH, SiLK, JSR or a porous dielectric;

filling the opening with a high-k dielectric material, wherein the high-k dielectric material includes at least one of $TaO_5$, $PSiN_x$, SiON, $TaO_2$, $ZrO_2$, $HfO_2$, or $Al2O_3$;

patterning the low-k dielectric layer outside of the opening and the high-k dielectric material to form an interconnect opening within the low-k dielectric layer and a capacitor opening within the high-k dielectric material, wherein the low-k dielectric layer and the high-k dielectric material are patterned concurrently; and filling the interconnect opening and the capacitor opening with a metal to form an interconnect in the low-k dielectric layer and a capacitor in the high-k dielectric material, wherein the filling of the interconnect opening and the capacitor opening with the metal is performed in a single process.

13. The method of claim 12, wherein the opening extends only partially into a depth of the low-k dielectric layer such that the low-k dielectric layer abuts the high-k dielectric material on at least two sides.

14. The method of claim 13, wherein the filling includes completely filling the opening, and wherein nearly an entirety of the opening is filled with the high-k dielectric material by the filling.

15. The method of claim 12, further comprising forming a liner in the opening within the low-k dielectric layer, wherein the liner extends along a sidewall of the opening and a bottom surface of the opening.

16. The method of claim 12, wherein filling the interconnect opening and the capacitor opening forms the interconnect and the capacitor on a same level of the IC structure, wherein the same level of the IC structure is defined as a same depth as measured from an upper surface of the low-k dielectric layer.

* * * * *